US010858581B2

(12) United States Patent
Dou et al.

(10) Patent No.: US 10,858,581 B2
(45) Date of Patent: Dec. 8, 2020

(54) HETEROJUNCTIONS IN HALIDE PEROVSKITE NANOSTRUCTURES

(71) Applicants: Letian Dou, West Lafayette, IN (US); Minliang Lai, El Cerrito, CA (US); Yiming Yang, Walnut Creek, CA (US); Peidong Yang, Kensington, CA (US)

(72) Inventors: Letian Dou, West Lafayette, IN (US); Minliang Lai, El Cerrito, CA (US); Yiming Yang, Walnut Creek, CA (US); Peidong Yang, Kensington, CA (US)

(73) Assignee: The Regents of the University of California, Oakland, CA (US)

(*) Notice: Subject to any disclaimer, the term of this patent is extended or adjusted under 35 U.S.C. 154(b) by 362 days.

(21) Appl. No.: 15/727,823

(22) Filed: Oct. 9, 2017

(65) Prior Publication Data

US 2018/0105743 A1    Apr. 19, 2018

Related U.S. Application Data

(60) Provisional application No. 62/409,191, filed on Oct. 17, 2016.

(51) Int. Cl.
*C30B 29/12* (2006.01)
*C09K 11/66* (2006.01)
*B82Y 40/00* (2011.01)
*B82Y 30/00* (2011.01)

(52) U.S. Cl.
CPC ............ *C09K 11/665* (2013.01); *B82Y 30/00* (2013.01); *B82Y 40/00* (2013.01); *C30B 29/12* (2013.01)

(58) Field of Classification Search
CPC ..... C09K 11/66; C09K 11/664; C09K 11/665; C09K 11/08; C30B 29/12; B82Y 30/00; B82Y 40/00
USPC ........ 428/357, 364, 373, 402; 977/755, 762, 977/773–777; 427/154, 560
See application file for complete search history.

(56) References Cited

U.S. PATENT DOCUMENTS

2017/0358759 A1* 12/2017 Lee .................. H01L 31/032
2019/0348577 A1* 11/2019 Pathak .................. C09K 11/06

OTHER PUBLICATIONS

L. Protesescu et al. "Nanocrystals of Cesium Lead Halide Perovskites (CsPbX3, X=Cl, Br, and I): Novel Optoelectronic Materials Showing Bright Emission with Wide Color Gamut" Nano Lett. 15, 3692-3696 (2015).
Z. Ning et al. "Quantum-dot-in-perovskite solids" Nature 523, 324-328 (2015).
D. Zhang et al. "Solution-Phase Synthesis of Cesium Lead Halide Perovskite Nanowires" J. Am. Chem. Soc. 137, 9230-9233 (2015).
(Continued)

*Primary Examiner* — Matthew D Matzek

(57) ABSTRACT

This disclosure provides systems, methods, and apparatus related to heterojunctions in halide perovskite nanostructures. In one aspect, a nanostructure comprises a first region and a second region. The first region comprises $ABX_3$, with A being selected from a group consisting of Cs and Rb, with B being selected from a group consisting of Sn and Pb, and with X being selected from a group consisting of Br, Cl, and Br and Cl. The second region comprises $ABY_3$, with Y being selected from a group consisting of Br, I, and Br and I. Compositions of the first region of the nanostructure and the second region of the nanostructure are different.

19 Claims, 14 Drawing Sheets

(56) References Cited

OTHER PUBLICATIONS

L. Dou et al. "Atomically thin two-dimensional organic-inorganic hybrid perovskites" Science 349, 1518-1521 (2015).
Q. A. Akkerman et al. "Solution Synthesis Approach to Colloidal Cesium Lead Halide Perovskite Nanoplatelets with Monolayer-Level Thickness Control" J. Am. Chem. Soc. 138, 1010-1016 (2016).
Q. A. Akkerman et al. "Tuning the Optical Properties of Cesium Lead Halide Perovskite Nanocrystals by Anion Exchange Reactions" J. Am. Chem. Soc. 137, 10276-10281 (2015).
G. Nedelcu et al. "Fast Anion-Exchange in Highly Luminescent Nanocrystals of Cesium Lead Halide Perovskites (CsPbX3, X=Cl, Br, I)" Nano Lett. 15, 5635-5640 (2015).
A. B. Wong et al. "Growth and Anion Exchange Conversion of CH3NH3PbX3 Nanorod Arrays for Light-Emitting Diodes" Nano Lett. 15, 5519-5524 (2015).
N. Pellet et al. "Transforming Hybrid Organic Inorganic Perovskites by Rapid Halide Exchange" Chem. Mater. 27, 2181-2188 (2015).
D. Zhang et al. "Synthesis of Composition Tunable and Highly Luminescent Cesium Lead Halide Nanowires through Anion-Exchange Reactions" J. Am. Chem. Soc. 138, 7236-7239 (2016).
K. Akamatsu et al. "Direct Patterning of Copper on Polyimide Using Ion Exchangeable Surface Templates Generated by Site-Selective Surface Modification" J. Am. Chem. Soc. 126, 10822-10823 (2004).
M. Lahav et al. "Patterning of Poly(acrylic acid) by Ionic Exchange Reactions in Microfluidic Channels" Adv. Mater. 18, 3174-3178 (2006).

R. D. Robinson et al. "Spontaneous Superlattice Formation in Nanorods Through Partial Cation Exchange" Science 317, 355-358 (2007).
K. Miszta et al. "Selective Cation Exchange in the Core Region of $Cu_2$—xSe/$Cu_2$—xS Core/Shell Nanocrystals" et al. Nano Lett. 14, 2116-2122 (2014).
F. Palazon et al. "X-ray Lithography on Perovskite Nanocrystals Films: From Patterning with Anion-Exchange Reactions to Enhanced Stability in Air and Water" ACS Nano 10, 1224-1230 (2016).
Y. Cui et al. "Nanowire Nanosensors for Highly Sensitive and Selective Detection of Biological and Chemical Species" Science 293, 1289-1292 (2001).
Y. Li et al. "Nanowire electronic and optoelectronic devices" Mater. Today 9, 18-27 (2006).
R. Yan et al. "Nanowire-based single-cell endoscopy" Nature Nanotech. 7, 191-196 (2012).
N. Dasgupta et al. "25th Anniversary Article: Semiconductor Nanowires—Synthesis, Characterization, and Applications" Adv. Mater. 26, 2137-2184 (2014).
S. W. Eaton et al. "Lasing in robust cesium lead halide perovskite nanowires" Proc. Natl. Acad. Sci. USA 113, 1993-1998 (2016).
H. Zhu et al. "Lead halide perovskite nanowire lasers with low lasing thresholds and high quality factors" Nat. Mater. 14, 636-612 (2015).
Letian Dou et al., "Spatially resolved multicolor CsPbX3 nanowire heterojunctions via anion exchange," PNAS Jul. 11, 2017 114 (28) 7216-7221.

\* cited by examiner

HETEROJUNCTIONS IN HALIDE PEROVSKITE NANOSTRUCTURES

RELATED APPLICATIONS

This application claims priority to U.S. Provisional Patent Application No. 62/409,191, filed Oct. 17, 2016, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to halide perovskites and more particularly to heterojunctions in halide perovskite nanostructures.

BACKGROUND

Significant research efforts are currently directed towards lead halide based perovskites due to their unusual optoelectronic and photovoltaic properties. In addition to polycrystalline thin films, various solution based synthetic routes towards low-dimensional nanostructures of halide perovskites have been recently demonstrated, with control over size, shape, mixed halide composition, and consequently their band gap and emission wavelength.

SUMMARY

Halide perovskites are promising semiconductor materials for solution-processed optoelectronic devices. Their strong ionic nature entails highly dynamic crystal lattices, allowing rapid ion exchange at the solid-vapor and solid-liquid interface. As described herein, the anion-exchange chemistry can be precisely controlled in single crystal halide perovskite nanomaterial. Spatially resolved multi-color $CsPbX_3$ (X=Cl, Br, I, or alloy of two halides) nanowire heterojunctions with a pixel size down to 500 nanometers (nm) with the photoluminescence tunable over the entire visible spectrum are demonstrated. In addition, the heterojunctions show distinct electronic states across the interface, as revealed by Kelvin probe force microscopy. These perovskite heterojunctions represent key building blocks for ultra-high-resolution multi-color displays beyond current state-of-art technology, as well as high-density diode/transistor arrays.

One innovative aspect of the subject matter described in this disclosure can be implemented in a method including providing a nanostructure comprising $APbX_3$. A is selected from a group consisting of rubidium (Rb) and cesium (Cs). X comprises a first halide selected from a group consisting of chlorine (Cl), bromine (Br), and iodine (I). A polymer is deposited on the nanostructure. A portion of the polymer is removed to expose a second region of the nanostructure. A first region of the nanostructure has the polymer disposed thereon. The second region of the nanostructure is contacted with a solution including a long-chain ammonium halide including a second halide. The second halide is a different halide than the first halide and is selected from a group consisting of Cl, Br, and I. At least some of the first halide of the nanostructure is replaced with the second halide.

In some implementations, the contacting forms a nanostructure comprising the first region and the second region. The first region of the nanostructure comprises $APbX_3$. The second region of the nanostructure comprises $APbY_3$. Y comprises the second halide that is a different halide than X.

Another innovative aspect of the subject matter described in this disclosure can be implemented in a method including providing a nanostructure comprising $APbBr_3$. A is selected from a group consisting of rubidium (Rb) and cesium (Cs). A polymer is deposited on the nanostructure. A portion of the polymer is removed to expose a second region of the nanostructure, with a first region of the nanostructure having the polymer disposed thereon. The second region of the nanostructure is contacted with a solution including oleylammonium chloride or oleylammonium iodide so at least some of the bromine (Br) in the nanostructure is replaced with chlorine (Cl) or iodine (I).

Another innovative aspect of the subject matter described in this disclosure can be implemented in a nanostructure including a first region and a second region. The first region comprises $APbX_3$, with A being selected from a group consisting of Rb and Cs, and with X being selected from a group consisting of Br, Cl, and Br and Cl. The second region comprises $APbY_3$, with Y being selected from a group consisting of Br, I, and Br and I. The compositions of the first region of the nanostructure and the second region of the nanostructure are different.

Another innovative aspect of the subject matter described in this disclosure can be implemented in a nanowire including a first region and a second region. The first region of the nanowire comprises $APbBr_3$. A is selected from a group consisting of Rb and Cs. The second region of the nanowire is selected from a group consisting of $APb(Br-Cl)_3$, $APbCl_3$, $APb(Br-I)_3$, and $APbI_3$.

Another innovative aspect of the subject matter described in this disclosure can be implemented in a method including providing a nanostructure comprising $ASnX_3$, with A being selected from a group consisting of cesium (Cs) and rubidium (Rb), and with X comprising a first halide selected from a group consisting of chlorine (Cl), bromine (Br), and iodine (I). A polymer is deposited on the nanostructure. A portion of the polymer is removed to expose a second region of the nanostructure, with a first region of the nanostructure having the polymer disposed thereon. The second region of the nanostructure is contacted with a solution including a long-chain ammonium halide including a second halide, the second halide being a different halide than the first halide and being selected from a group consisting of Cl, Br, and I. At least some of the first halide of the nanostructure is replaced with the second halide.

In some implementations, the contacting is performed for about 1 minute to 7200 minutes. In some implementations, the solvent of the solution including the long-chain ammonium halide comprises a non-polar solvent.

In some implementations, the method further comprises removing a remainder of the polymer from the nanostructure. In some implementations, during the depositing, the removing, and the contacting, the nanostructure is disposed on a substrate. In some implementations, the polymer is selected from a group consisting of methyl methacrylate (MMA), poly(methyl methacrylate) (PMMA), hydrogen silsesquioxane, and halogenated methacrylate homo and copolymers.

In some implementations, the contacting forms a nanostructure comprising the first region and the second region, where the first region of the nanostructure comprises $ASnX_3$, where the second region of the nanostructure comprises $ASnY_3$, and where Y comprises the second halide that is a different halide than X. In some implementations, the nanostructure comprising $ASnX_3$ consists of a single crystal, the nanostructure is selected from a group consisting of a nanowire and a nanoplate. In some implementations, the nanostructure has at least one dimension that is greater than about 500 nanometers.

Another innovative aspect of the subject matter described in this disclosure can be implemented in a nanostructure including a first region and a second region. The first region comprises $ASnX_3$. A is selected from a group consisting of Cs and Rb. X is selected from a group consisting of Br, Cl, and Br and Cl. The second region comprises $ASnY_3$. Y is selected from a group consisting of Br, I, and Br and I. The compositions of the first region of the nanostructure and the second region of the nanostructure are different.

In some implementations, the nanostructure has at least one dimension that is greater than about 500 nanometers. In some implementations, the first region of the nanostructure comprises $ASn(Br-Cl)_3$ or $ASnCl_3$, and the second region of the nanostructure comprises $ASnBr_3$. In some implementations, the first region of the nanostructure comprises $ASnBr_3$, and the second region of the nanostructure comprises $ASn(Br-I)_3$ or $ASnI_3$. In some implementations, the first region of the nanostructure comprises $ASn(Br-Cl)_3$ or $ASnCl_3$, and the second region of the nanostructure comprises $ASn(Br-I)_3$ or $ASnI_3$.

In some implementations, the nanostructure consists of a single crystal. In some implementations, the nanostructure is selected from a group consisting of a nanowire and a nanoplate.

Another innovative aspect of the subject matter described in this disclosure can be implemented in a nanowire comprising a first region and a second region. The first region of the nanowire comprises $ASnBr_3$. The second region of the nanowire is selected from a group consisting of $ASn(Br-Cl)_3$, $ASnCl_3$, $ASn(Br-I)_3$, and $ASnI_3$, with A being selected from a group consisting of Cs and Rb.

In some implementations, the nanowire has a diameter of about 2 nanometers to 1000 nanometers and a length greater than about 500 nanometers. In some implementations, the nanowire consists of a single crystal.

Another innovative aspect of the subject matter described in this disclosure can be implemented in a method including providing a nanostructure comprising $ABX_3$. A is selected from a group consisting of cesium (Cs) and rubidium (Rb). B is selected from a group consisting of tin (Sn) and lead (Pb). X comprises a first halide selected from a group consisting of chlorine (Cl), bromine (Br), and iodine (I). A polymer is deposited on the nanostructure. A portion of the polymer is removed to expose a second region of the nanostructure, with a first region of the nanostructure having the polymer disposed thereon. The second region of the nanostructure is contacted with a solution including a long-chain ammonium halide including a second halide, the second halide being a different halide than the first halide and being selected from a group consisting of Cl, Br, and I. At least some of the first halide of the nanostructure is replaced with the second halide.

In some implementations, the contacting is performed for about 1 minute to 7200 minutes. In some implementations, the solvent of the solution including the long-chain ammonium halide comprises a non-polar solvent.

In some implementations, the method further comprises removing a remainder of the polymer from the nanostructure. In some implementations, during the depositing, the removing, and the contacting, the nanostructure is disposed on a substrate. In some implementations, the polymer is selected from a group consisting of methyl methacrylate (MMA), poly(methyl methacrylate) (PMMA), hydrogen silsesquioxane, and halogenated methacrylate homo and copolymers.

In some implementations, the contacting forms a nanostructure comprising the first region and the second region, where the first region of the nanostructure comprises $ABX_3$, where the second region of the nanostructure comprises $ABY_3$, and where Y comprises the second halide that is a different halide than X. In some implementations, the nanostructure comprising $ABX_3$ consists of a single crystal. In some implementations, the nanostructure is selected from a group consisting of a nanowire and a nanoplate. In some implementations, the nanostructure has at least one dimension that is greater than about 500 nanometers.

Another innovative aspect of the subject matter described in this disclosure can be implemented in a nanostructure comprising a first region and a second region. The first region comprises $ABX_3$. A is selected from a group consisting of Cs and Rb. B is selected from a group consisting of Sn and Pb. X is selected from a group consisting of Br, Cl, and Br and Cl. The second region comprises $ABY_3$. Y is selected from a group consisting of Br, I, and Br and I. Compositions of the first region of the nanostructure and the second region of the nanostructure are different.

In some implementations, the nanostructure has at least one dimension that is greater than about 500 nanometers. In some implementations, the first region of the nanostructure comprises $AB(Br-Cl)_3$ or $ABCl_3$, and the second region of the nanostructure comprises $ABBr_3$. In some implementations, the first region of the nanostructure comprises $ABBr_3$, and the second region of the nanostructure comprises $AB(Br-I)_3$ or $ABI_3$. In some implementations, the first region of the nanostructure comprises $AB(Br-Cl)_3$ or $ABCl_3$, and the second region of the nanostructure comprises $AB(Br-I)_3$ or $ABI_3$.

In some implementations, the nanostructure consists of a single crystal. In some implementations, the nanostructure is selected from a group consisting of a nanowire and a nanoplate.

Another innovative aspect of the subject matter described in this disclosure can be implemented in a nanowire comprising a first region and a second region. The first region of the nanowire comprises $ABBr_3$. The second region of the nanowire is selected from a group consisting of $AB(Br-Cl)_3$, $ABCl_3$, $AB(Br-I)_3$, and $ABI_3$. A is selected from a group consisting of Cs and Rb. B is selected from a group consisting of Sn and Pb.

In some implementations, the nanowire has a diameter of about 2 nanometers to 1000 nanometers and a length greater than about 500 nanometers. In some implementations, the nanowire consists of a single crystal.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 6A shows an example of a 3D atomic force microscopy (AFM) topographical view of a typical Br—Cl exchanged heterojunction nanowire on $SiO_2$/Si. The dashed line indicates the interface of the bromide (left) and chloride (right) parts. FIG. 6B shows an example of the corresponding height profile of the heterojunction nanowire. FIG. 6C shows an example of a 3D view of the Kelvin probe force microscopy (KPFM) surface potential mapping of the heterojunction nanowire. FIG. 6D shows an example of the corresponding potential profile across the junction interface with the corresponding AFM height profile. FIG. 6E shows example of work functions of the pure $CsPbBr_3$ and $CsPbCl_3$ nanowires determined by quantitative KPFM. The squares indicate the band gap of the pure $CsPbBr_3$ and $CsPbCl_3$. FIG. 6F shown an example of a proposed band alignment of the $CsPbBr_3$—$CsPbCl_3$ heterojunction nanowire. FIG. 6G shows an example of a 3D view of the KPFM surface potential mapping of a multi-segment heterojunction nanowire (each segment is ~3 microns long) and the corresponding potential profile along the nanowire.

DETAILED DESCRIPTION

Figure 1A:
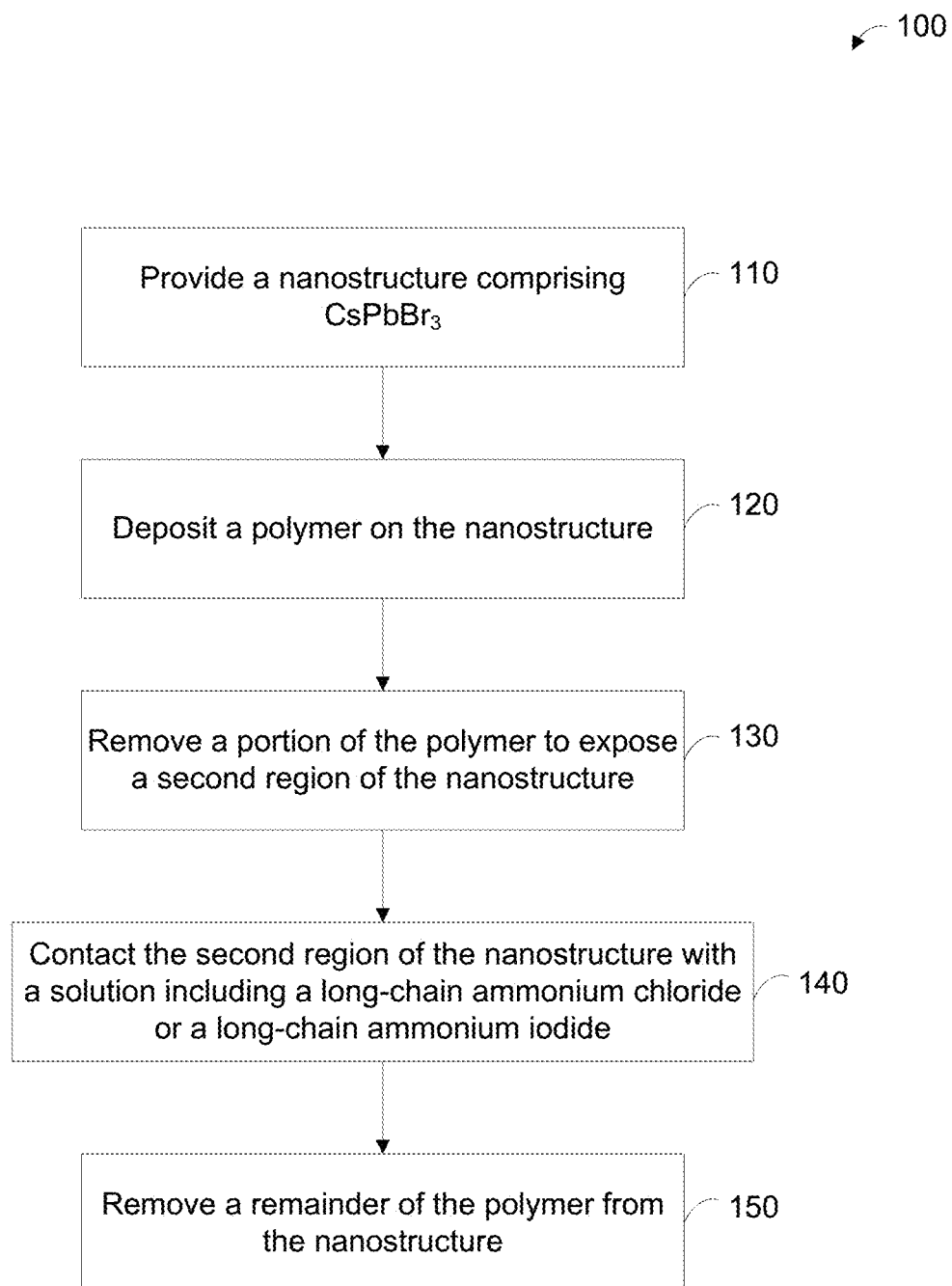
FIG. 1A shows an example of a flow diagram illustrating a process for fabricating a heterojunction in a perovskite nanostructure.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

Interestingly, it has been shown that lead halide based perovskites, both in bulk and in nanocrystalline form, can undergo fast anion-exchange reactions at the solid-liquid or solid-gas interface, with a fine-tuning of the chemical composition and electronic properties. The fast ion-exchange kinetics in halide perovskites is related to the low defect formation energy and the existence of large number of vacancies, which make the ions highly mobile in the crystal lattice. As a result, the anion-exchange reaction in halide perovskites favors forming homogeneous alloys instead of any kind of heterostructures as commonly observed in II-VI semiconductor compounds. The fast kinetics also makes it difficult to capture any intermediate states, and thus prevents a detailed dynamic study.

If the exchange reaction, however, can be localized at particular positions, then it is possible to produce substrates with well-defined patterns of semiconductor heterojunctions. A heterojunction is the interface that occurs between two layers or regions of dissimilar crystalline semiconductors. These semiconducting materials have unequal band gaps as opposed to a homojunction. The physical properties (optical, electrical, magnetic, etc.) of the heterostructure are fundamentally interesting, and patterned semiconductor heterojunctions are needed for the fabrication of large-scale high-density integrated electronic and photonic devices.

Compared to the perovskite polycrystalline thin films and quantum dots, single crystal nanowires provide an ideal platform for producing and studying heterojunctions via ion-exchange chemistry because of the absence of grain boundaries and the one-dimensional geometry. The relatively thin diameter of the nanowire ensures rapid ion exchange in the radial direction, while the micron scale length creates a natural channel for studying the optical and electrical properties of the junction and observing ion diffusion and interface propagation. Moreover, a relatively small cross-sectional area makes the nanowire more tolerant to interfacial strain that is induced by crystal lattice mismatch (composition change) across the junction. Advanced functionality also can be achieved by creating multiple junctions within a single nanowire.

FIG. 1 shows an example of a flow diagram illustrating a process for fabricating a heterojunction in a perovskite nanostructure. FIGS. 2A-2E show examples of schematic illustrations of a perovskite nanostructure at various stages in the fabrication process. Starting at block 110 of the method 100 shown in FIG. 1, a nanostructure comprising $CsPbBr_3$ or a nanostructure consisting of $CsPbBr_3$ is provided. In some embodiments, the nanostructure is selected from a group consisting of a nanowire and a nanoplate. In some embodiments, the nanostructure is not a nanoparticle. In some embodiments, the nanostructure is not a quantum dot. In some embodiments, the nanostructure has at least one dimension that is greater than about 500 nanometers (nm). In some embodiments, the nanostructure comprises or consists of only one crystal. That is, the nanostructure is not polycrystalline in some embodiments. In some embodiments, the nanostructure is disposed on a substrate.

For example, in some embodiments, the nanostructure comprises a nanowire. In some embodiments, the nanowire has a diameter of about 2 nm to 1000 nm and a length greater than about 500 nm. In some embodiments, the nanowire has a diameter of about 100 nm to 500 nm and a length of about 1 micrometer to 40 micrometers. In some embodiments, the nanostructure comprises nanoplate. In some embodiments, when the nanoplate is square or rectangular, a dimension of one side of the square or rectangle is greater than about 500 nm. In some embodiments, when the nanoplate is circular or oval-shaped, a diameter or a major axis of the nanoplate is greater than about 500 nm. In some embodiments, the nanoplate has a thickness of about 2 nm to 750 nm.

The nanostructure comprising $CsPbBr_3$ may be fabricated using a number of different methods. Some methods are described in Zhang et al., "Solution-Phase Synthesis of Cesium Lead Halide Perovskite Nanowires," J. Am. Chem. Soc., 2015, 137 (29), pp. 9230-9233 and Eaton et al., "Lasing in Robust Cesium Lead Halide Perovskite Nanowires," Proceedings of the National Academy of Sciences, 2016, vol. 113 no. 8, pp. 1993-1998, both of which are herein incorporated by reference. Methods of fabricating nanostructures comprising $CsPbBr_3$ are also described in U.S. Provisional Patent Application Ser. No. 62/290,009, titled "INORGANIC HALIDE PEROVSKITE NANOWIRES AND METHODS OF FABRICATION THEREOF," filed Feb. 2, 2016 and U.S. Provisional Patent Application Ser. No. 62/342,094, titled "ANION-EXCHANGE IN INORGANIC HALIDE PEROVSKITE NANOWIRES," filed May 26, 2016, both of which are herein incorporated by reference.

For example, a nanowire comprising $CsPbBr_3$ may be fabricated by depositing lead iodide on a substrate. In some embodiments, depositing lead iodide on a substrate comprises depositing a solution of lead iodide in a solvent on the substrate and then evaporating the solvent. Depositing the solution on the substrate may be performed with a spin coating process, for example. In some embodiments, the solvent comprises a solvent selected from a group consisting of dimethylformamide (DMF) and dimethyl sulfoxide (DMSO). In some embodiments, evaporating the solvent comprises annealing the substrate at about 70° C. to 100° C. for about 10 minutes to 20 minutes.

In some embodiments, the substrate comprises a material that the solution of lead iodide in a solvent wets. In some embodiments, the substrate comprises a glass. In some embodiments, the glass is oxygen plasma treated. An oxygen plasma treatment may clean the glass and improve its wetting properties (i.e., decrease the hydrophobicity of the glass and reduce the contact angle between the glass and the solution). In some embodiments, a polymer may be disposed on a surface of the substrate. The lead iodide solution may wet the polymer. For example, in some embodiments, the polymer comprises a hydrophilic polymer. In some embodiments, the polymer comprises a polymer selected from a group consisting of poly(3,4-ethylenedioxythiophene) (PEDOT), poly(3,4-ethylenedioxythiophene) polystyrene sulfonate (PEDOT:PSS), and polyaniline.

The lead iodide is contacted with a solution of cesium bromide in a first alcohol. In some embodiments, the lead iodide is contacted with the solution of the cesium bromide in the first alcohol at about 20° C. to 80° C. for about 6 hours to 18 hours. For example, the substrate with the lead iodide disposed thereon may be immersed in a solution of the cesium bromide in the first alcohol. A reaction between the lead iodide and the cesium bromide forms a nanowire comprising $CsPbBr_3$. The first alcohol may comprise a short chain alcohol. For example, in some embodiments, the first alcohol comprises methyl alcohol or ethyl alcohol. In some embodiments, the lead iodide is contacted with a solution of cesium bromide in a first alcohol in an inert gas atmosphere.

In some embodiments, the nanowire is then washed with a second alcohol. The second alcohol is used to clean with nanowire without damaging it. The second alcohol may be an alcohol that is less polar than methyl alcohol. For example, in some embodiments, the second alcohol comprises isopropyl alcohol.

Figure 2A:
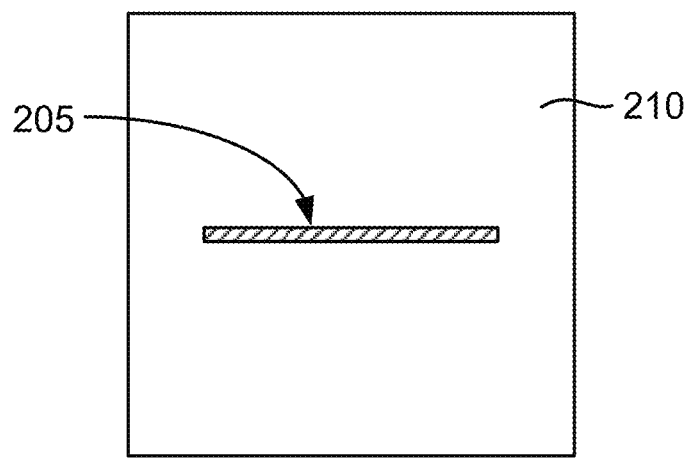
FIGS. 2A-2E show examples of schematic illustrations of a perovskite nanostructure at various stages in the fabrication process.

FIG. 2A shows an example of the nanostructure up through block 110 in the method 100. The nanostructure shown in FIGS. 2A-2E comprises a nanowire. As shown in FIG. 2A, a nanowire 205 comprising $CsPbBr_3$ or being $CsPbBr_3$ is disposed on a substrate 210. In some embodiments, the substrate 210 comprises a silicon substrate having a layer of $SiO_2$ on a surface of the silicon substrate, with the nanowire 205 being disposed on the layer of $SiO_2$.

At block 120, a polymer is deposited on the nanostructure. In some embodiments, the entire nanostructure is covered with the polymer. In some embodiments, the polymer is a photoresist or an electron-beam resist. In some embodiments, the polymer is selected from a group consisting of methyl methacrylate (MMA), poly(methyl methacrylate) (PMMA), hydrogen silsesquioxane, and halogenated methacrylate homo and copolymers. In some embodiments, the as-deposited polymer has a thickness of about 100 nm to 500 nm. The polymer serves to prevent a solution including a long-chain ammonium chloride or a long-chain ammonium iodide from contacting the entire nanostructure at block 140. In some embodiments, the polymer is thick enough to prevent a solution including a long-chain ammonium chloride or a long-chain ammonium iodide from contacting the entire nanostructure at block 140.

Figure 2B:
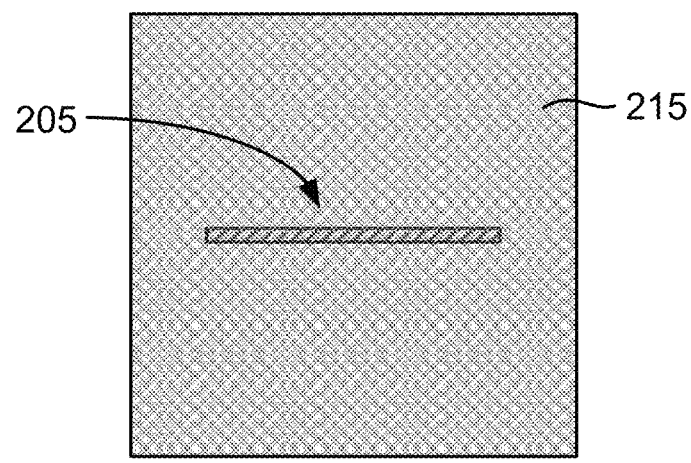

FIG. 2B shows an example of the nanowire up through block 120 in the method 100. A polymer 215 is disposed on the nanowire 205.

At block 130, a portion of the polymer is removed to expose a second region of the nanostructure. A first region of the nanostructure remains covered with the polymer. In some embodiments, the polymer can be removed with a lithography process, including photolithography and electron-beam lithography. In some embodiments, a region of a surface of the nanostructure is exposed. In some embodiments, the second region of the nanostructure exposed is one half of the area of the nanostructure (as shown in FIG. 2B), one third of the area of the nanostructure, or one quarter of the area of the nanostructure. For example, when the nanostructure comprises a nanowire, a length of about 1 micron, 500 nanometers, 200 nanometers, 100 nanometers, or 50 nanometers of the nanowire may be exposed.

Figure 2C:
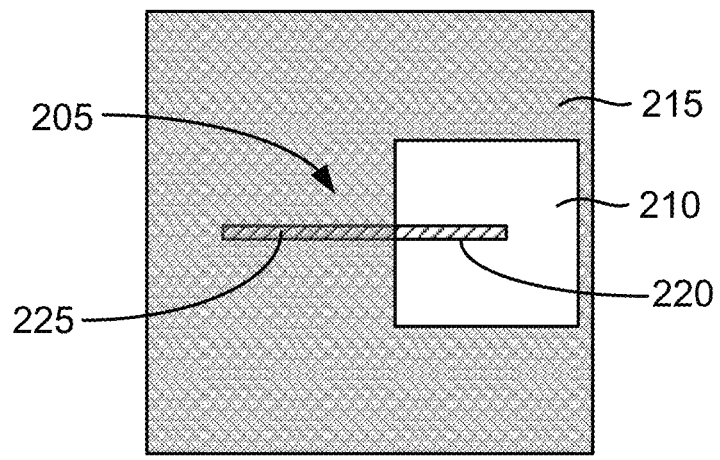

FIG. 2C shows an example of the nanowire up through block 130 in the method 100. As shown in FIG. 2C, the polymer 215 is disposed on a first region 225 of the nanowire 205. A second region 220 of the nanowire 205 is exposed and does not have the polymer 215 disposed thereon. A region of the substrate 210 may also be exposed after a portion of the polymer 215 is removed at block 130.

At block 140, the second region of the nanostructure is contacted with a solution including a long-chain ammonium chloride or a long-chain ammonium iodide (i.e., a long-chain ammonium halide). Examples of long-chain ammonium chlorides and iodides include oleylammonium chloride and oleylammonium iodide. Additional examples of long-chain ammonium halides (i.e., chlorides and iodides) include C8 through C24 (C8-C24) linear alkyl ammonium halides and di-, tri-, and tert-alkyl ammonium halides. At least some of the Br in the nanostructure is replaced with Cl or I.

In some embodiments, contacting the second region of the nanostructure is performed by immersing the substrate and the nanostructure in the solution or depositing a droplet or droplets of the solution on the nanostructure. The solvent of the solution is specified so that solution does not react with the polymer. For example, in some embodiments, the solvent of the solution comprises a non-polar solvent. In some embodiments, the solvent comprises a C8 though C24 (C8-C24) olefin or octadecene (ODE). In some embodiments, a concentration of the long-chain ammonium chloride or long-chain ammonium iodide in the solution is about 0.1 milligrams per milliliter (mg/mL) to 10 mg/mL or about 0.1 mg/mL to 5 mg/mL. In some embodiments, the nanostructure is contacted with the solution for about 1 minute to 7200 minutes, about 60 minutes to 5760 minutes, or about 240 minutes to 4320 minutes.

The length of time for which the second region of the nanostructure is contacted with the solution determines, in part, the degree to which Br is replaced with Cl or I in the anion exchange process. Generally, the longer the period of time that the second region of the nanostructure is contacted with the solution, the greater the degree to which the anion exchange process occurs with Br being replaced with Cl or I. The concentration of the long-chain ammonium chloride or long-chain ammonium iodide in the solution determines, in part, the degree to which Br is replaced with Cl or I in the anion exchange process. Generally, the higher the concentration of the long-chain ammonium chloride or long-chain ammonium iodide in the solution, the faster the anion exchange (i.e., Br being replaced with Cl or I) will occur. The concentration of the long-chain ammonium chloride or long-chain ammonium iodide in the solution is specified such that the anion exchange process does not occur too quickly such that the morphology of the nanostructure is damaged. For example, if Br is completely replaced with Cl or I in 10 minutes or less, the morphology of the nanostructure may be damaged. In some embodiments, lower concentrations of the long-chain ammonium chloride or long-chain ammonium iodide in the solution and short exposure times may be used to generate a composition of the nanostructure in which a small amount of Br is exchanged with Cl or I.

Figure 2D:
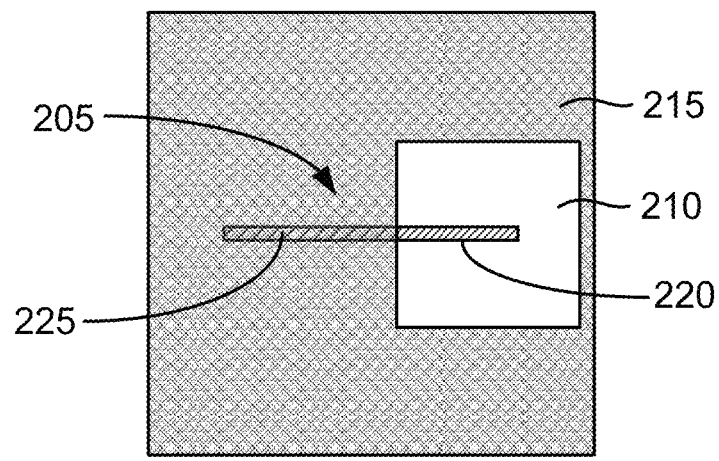

FIG. 2D shows an example of the nanowire up through block 140 in the method 100. As shown in FIG. 2D, the polymer 215 disposed on the first region 225 of the nanowire 205 prevents the anion exchange process from occurring in the first region 225 of the nanowire 205. The composition of the first region 225 of the nanowire 205, which is not in contact with solution including the long-chain ammonium chloride or long-chain ammonium iodide, is not changed and comprises $CsPbBr_3$ or is $CsPbBr_3$. An anion exchange process occurs in the second region 220 of the nanowire 205 which was contacted with the solution including the long-chain ammonium chloride or the long-chain ammonium iodide. In some embodiments, the composition of the second region 220 of the nanowire 205 comprises $CsPbX_3$ or is $CsPbX_3$, where X is selected from a group consisting of Cl, Br and Cl, I and Br, and I.

At block 150, a remainder of the polymer is removed from the nanostructure. In some embodiments, the remainder of the polymer is removed with a solvent. For example, chloroform or chlorobenzene may be used to remove PMMA.

Figure 2E:
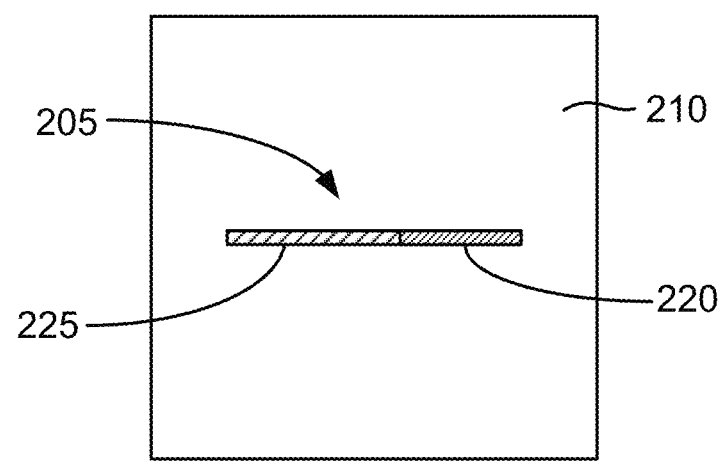

FIG. 2E shows an example of the nanowire up through block 150 in the method 100. The nanowire 205 is disposed on the substrate 210. The first region 225 of the nanowire comprises $CsPbBr_3$ or is $CsPbBr_3$. In some embodiments, the composition of the second region 225 of the nanowire 205 comprises $CsPbX_3$ or is $CsPbX_3$, where X is selected from a group consisting of Cl, Br and Cl, I, and Br, and I. In some embodiments, after block 150 the nanowire 205 consists of a single crystal. In some embodiments, after block 150 the nanowire 205 comprises or consists of only one crystal. That is, after block 150 the nanowire 205 is not polycrystalline in some embodiments.

Figure 1B:
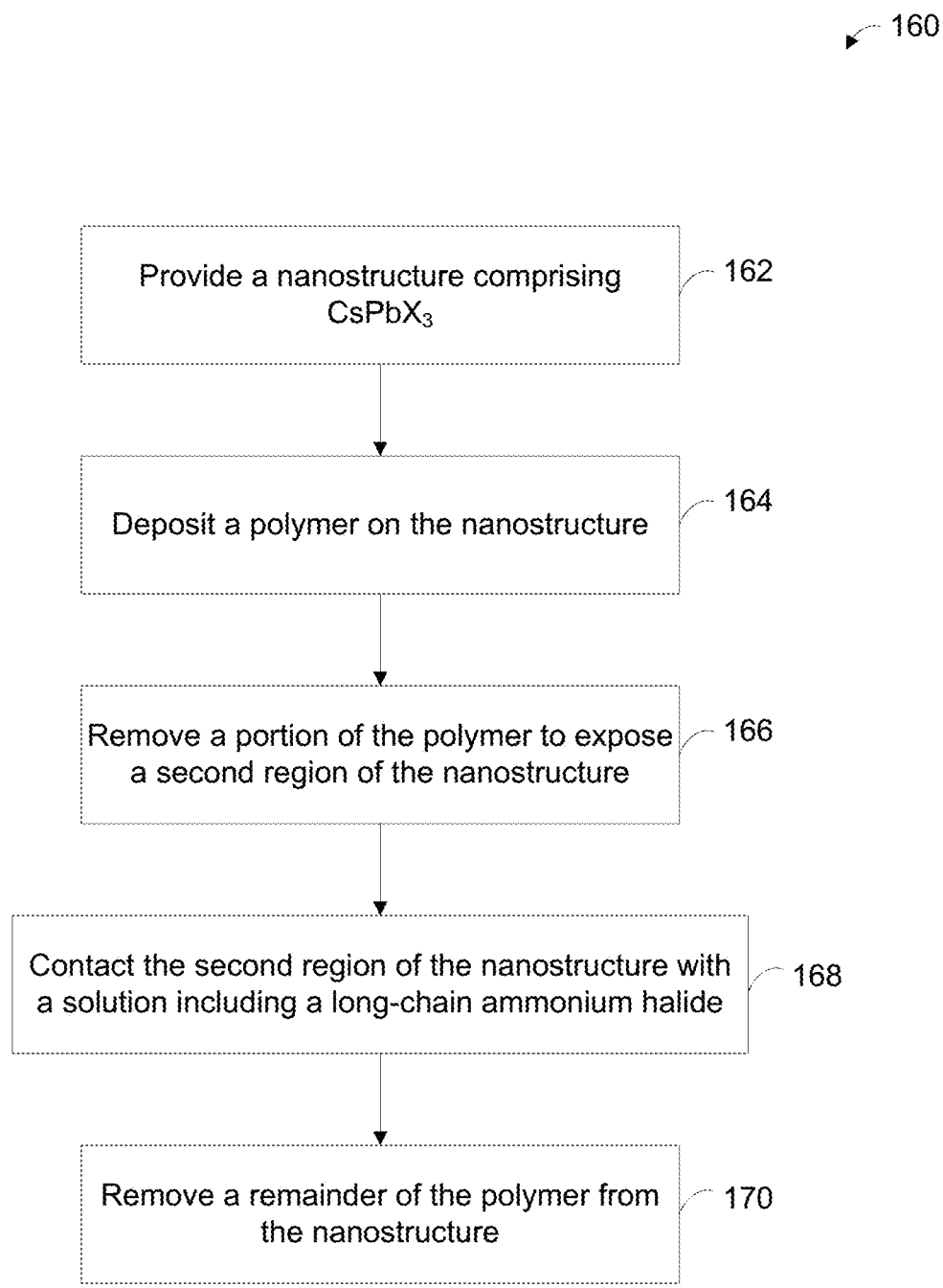
FIG. 1B shows an example of a flow diagram illustrating a process for fabricating a heterojunction in a perovskite nanostructure.
Figure 2F:
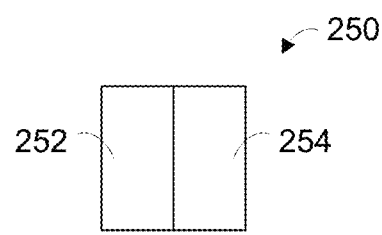
FIG. 2F shows an example of a schematic illustration of a nanoplate that has been processed according to the method 100 shown in FIG. 1.

FIG. 2F shows an example of a schematic illustration of a nanoplate that has been processed according to the method 100 shown in FIG. 1. A first region 252 of the nanoplate 250 comprises $CsPbBr_3$ or is $CsPbBr_3$. In some embodiments, the composition of a second region 254 of the nanowire 250 comprises $CsPbX_3$ or is $CsPbX_3$, where X is selected from a group consisting of Cl, Br and Cl, I, and Br, and I. In some embodiments, the nanoplate 250 consists of a single crystal after the method 100. In some embodiments, after the method 100 the nanoplate 250 comprises or consists of only one crystal.

In some embodiments, after block 150 of the method 100, blocks 120, 130, 140 and 150 are repeated, with a slight variation in block 130. In some embodiments, when the method 100 is repeated, at block 130, a portion of the polymer is removed to expose the first region of the nanostructure. When the method 100 is repeated, at block 140 the first region of the nanostructure is contacted with a solution including the long-chain ammonium chloride or long-chain ammonium iodide so at least some of the Br in the first region nanostructure is replaced with Cl or I.

Thus, in some embodiments, the method 100 can be used to fabricate a nanostructure having variations of the compositions of halides. In some embodiments, a first region of the nanostructure comprises $CsPbX_3$ and a second region of the nanostructure comprises $CsPbY_3$. X is selected from a group consisting of Br, Cl, and Br and Cl, and Y is selected from a group consisting of Br, I, and Br and I, with compositions of the first region of the nanostructure and the second region of the nanostructure being different.

For example, in some embodiments, the first region of the nanostructure comprises $CsPb(Br-Cl)_3$ or $CsPbCl_3$, and the second region of the nanostructure comprises $CsPbBr_3$. In some embodiments, the first region of the nanostructure comprises $CsPbBr_3$, and the second region of the nanostructure comprises $CsPb(Br-I)_3$ or $CsPbI_3$. In some embodiments, the first region of the nanostructure comprises $CsPb(Br-Cl)_3$ or $CsPbCl_3$, and the second region of the nanostructure comprises $CsPb(Br-I)_3$ or $CsPbI_3$.

Another variation on the method 100 includes exposing multiple different regions of a $CsPbBr_3$ nanostructure to a long-chain ammonium chloride or a long-chain ammonium iodide. In some instances, regions of a nanostructure may not be exposed to a long-chain ammonium chloride or a long-chain ammonium iodide. Using such a method, a nanostructure having multiple different regions could be fabricated. For example, in some embodiments, a nanostructure comprises a first region, a second region, and a third region. In some embodiments, the first region comprises $CsPbI_3$ or $CsPb(Br-I)_3$ or is $CsPbI_3$ or $CsPb(Br-I)_3$, a second region comprises $CsPbBr_3$ or is $CsPbBr_3$, and a third region comprises $CsPbCl_3$ or $CsPb(Br-Cl)_3$ or is $CsPbCl_3$ or $CsPb(Br-Cl)_3$. In some embodiments, a length of each of the first region, the second region, and the third region is about 50 nm to 1000 nm. In some embodiments, lengths of each of the first region, the second region, and the third region are the same. In some embodiments, lengths of each of the first region, the second region, and the third region are different.

Yet another variation of the method 100 is to provide a nanostructure comprising a cesium lead halide perovskite that is not necessarily $CsPbBr_3$ (e.g., the cesium lead halide perovskite could be $CsPbCl_3$ or $CsPbI_3$). FIG. 1B shows an example of such a method. FIG. 1B shows an example of a flow diagram illustrating a process for fabricating a heterojunction in a perovskite nanostructure. Some operations shown in FIG. 1B are the same as or similar to the operations shown in FIG. 1A.

Starting at block 162 in the method 160 shown in FIG. 1B, a nanostructure comprising $CsPbX_3$ is provided. X comprises a first halide selected from a group consisting of chlorine (Cl), bromine (Br), and iodine (I). At block 164, a polymer is deposited on the nanostructure. At block 166, a portion of the polymer is removed to expose a second region of the nanostructure. A first region of the nanostructure has the polymer disposed thereon. At block 168, the second region of the nanostructure is contacted with a solution including a long-chain ammonium halide including a second halide. The second halide is a different halide than the first halide and is selected from a group consisting of Cl, Br, and I. At least some of the first halide of the nanostructure is replaced with the second halide. At block 170, a remainder of the polymer is removed from the nanostructure.

For example, when the nanostructure comprises $CsPbCl_3$, the second region could be contacted with a long-chain ammonium bromide or a long-chain ammonium iodide. When the nanostructure comprises $CsPbI_3$, the second region could be contacted with a long-chain ammonium bromide or a long-chain ammonium chloride.

Further variations of the methods and nanostructures described herein are also possible. For example, in some embodiments, the nanostructure provided comprises a rubidium lead halide perovskite ($RbPbX_3$), a cesium tin halide perovskite ($CsSnX_3$), or a rubidium tin halide perovskite ($RbSnX_3$). Heterojunctions can be formed by anion-exchange with all of these perovskite compositions.

Yet further variations of the methods and nanostructures described herein are also possible. For example, in some embodiments, instead of providing a nanostructure comprising a cesium lead halide perovskite, a nanostructure comprising a methylammonium lead halide perovskite, a methylammonium tin halide perovskite, a formamidinium lead halide perovskite, or a formamidinium tin halide perovskite is provided.

EXAMPLES

The following examples are intended to be examples of the embodiments disclosed herein, and are not intended to be limiting.

As described below, spatially resolved $CsPbX_3$ (X=Cl, Br, I, or alloys of two halides) semiconductor nanowire heterojunctions with a pixel size down to 500 nm and multiple emission colors are demonstrated. Selected area anion-exchange from cesium lead bromide to cesium lead chloride or iodide can achieved at high spatial resolution by electron-beam (e-beam) lithography. A sharp junction is observed, with distinct optical and electronic properties across the heterojunction interface. Intricate patterns on $CsPbBr_3$ plates were also fabricated with the method.

$CsPbBr_3$ nanowires as well as some nanoplates were grown using a solution-based method. 460 mg $PbI_2$ (99.999%) was dissolved in 1 mL anhydrous dimethylformide (DMF) and stirred at 70° C. overnight before further use. The $PbI_2$ solution was spun onto a PEDOT:PSS-coated glass substrates at 1000 rpm for 120 seconds, then annealed at 100° C. for 15 minutes. The $PbI_2$ film was submerged into a glass vial with 8 mg/mL CsBr (99.999%) solution in methanol (anhydrous, 99.8%), with the $PbI_2$ side facing up. The capped reaction vial was heated to 50° C. for 12 hours, and the substrate was removed and washed twice in anhydrous isopropanol (each time for 30 seconds). The sample was then dried by heating to 50° C. for 5 minutes. The diameter of the nanowires were typically several hundreds of nanometers with length up to 30 micrometers.

To study the anion-exchange chemistry on a single nanowire, individual $CsPbBr_3$ nanowires were picked using a micromanipulator and transferred to a clean $SiO_2$/Si substrate. A droplet of reaction solution containing oleylammonium chloride in 1-octadecene was used to cover the nanowire on the substrate. The reaction was in situ examined under a microscope with a 325 nm laser excitation. During the reaction period (around 12 hours), the photoluminescence (PL) of the nanowire gradually blue shifted, without the coexistence of both green and purple-blue emission from pure $CsPbBr_3$ and $CsPbCl_3$, indicating the formation of homogenous $CsPbX_3$ alloys instead of any $Br^-$ or $Cl^-$ rich domains. For cesium lead halide perovskites, the anion-exchange reaction zone width is probably close to the crystal size, which leads to alloy formation instead of a core-shell structure. The reaction dynamics are important for controlling the conversion degree and therefore the optical and electronic properties of the nanowire. The mild reaction conditions described here are needed for maintaining the nanowire morphology and for compatibility with nanofabrication processes.

Next, the anion-exchange chemistry on partially masked nanowires for creating spatially well-defined heterojunctions was studied. After transferring a nanowire to a substrate (e.g., a $SiO_2$ coated Si substrate), a thin layer of poly(methyl methacrylate) (PMMA) was spin-cast on the nanowire. An area of the PMMA was removed using e-beam lithography in order to expose part of the nanowire. Then the substrate was dipped into an oleylammonium halide (OAmX, X=Cl, I) solution. To convert the $CsPbBr_3$ to $CsPbCl_3$, 10 mg of oleylammonium chloride was dissolved in 10 mg of 1-Octadecene (ODE) to make the conversion solution. A nanowire was immersed in the conversion solution at room temperature for 16 hours for complete conversion. To convert the $CsPbBr_3$ to $CsPbI_3$, 10 mg of oleylammonium iodide was dissolved in 10 mg of ODE to make the conversion solution. A nanowire was immersed in the conversion solution at room temperature for 4 hours for complete conversion. During the reactions, the PMMA layer remained intact. After the anion-exchange reaction, the PMMA layer was completely removed by washing with chlorobenzene and hexanes. It is noted that the bromide part and the chloride part show a weak contrast difference even in an optical image.

The photoluminescence (PL) emission of the individual nanowires after reaction was examined. FIGS. 3A, 3B, 4A, and 4B show the optical images and PL spectra of the Br—Cl and Br—I partially exchanged nanowires, respectively. Both nanowires feature two color emission with a clear, sharp interface. In the Br—Cl exchange sample, the blue part has an emission peak centered at 420 nm, suggesting a complete conversion from $CsPbBr_3$ to $CsPbCl_3$. In the Br—I exchange case, the red region shows an emission peak centered at 655 nm, corresponding to ~80% Br—I conversion. Notably, there is no additional emission peaks between the two major peaks in the PL spectra, which means the interface of the junction is relatively sharp with no significant inter diffusion of the $Br^-$ and $Cl^-/I^-$ ions. Such a high quality junction is important for electronic device applications.

The elemental distribution and morphology of the nanowires after anion exchange was examined by scanning electron microscopy (SEM). SEM energy-dispersive X-ray spectroscopy (EDS) mapping on a heterojunction nanowire showed a clear interface between the bromide section and chloride section, while other elements such as lead and cesium were uniformly distributed within the whole nanowire.

Figures 5A, 5B:
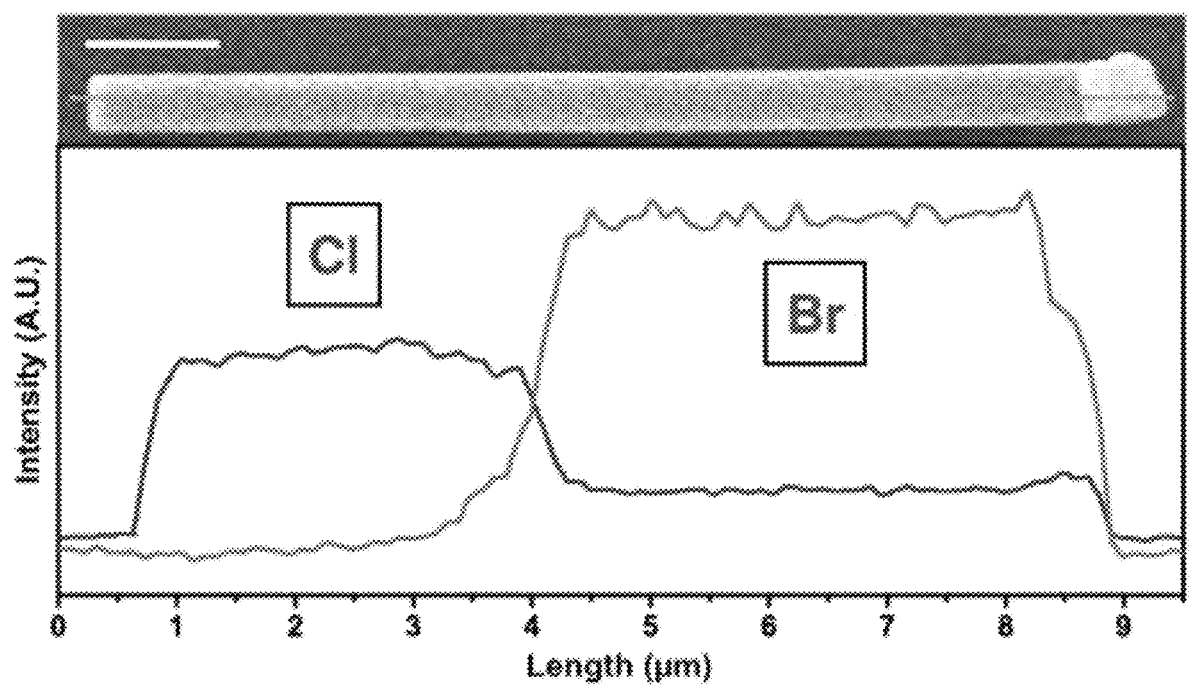
FIG. 5A shows an example of a scanning electron microscopy (SEM) image of a heterojunction nanowire. The scale bar is 1 micron.
FIG. 5B shows an example of the corresponding chlorine and bromine distribution profile along the nanowire.

FIG. 5A shows an SEM image of a $CsPbCl_3$ and $CsPbBr_3$ nanowire. FIG. 5B shows the relative bromide and chloride concentration profiles along the nanowire. The concentration profiles show that both elements were spatially confined. Dramatic changes of Cl and Br concentrations at the interface region are observed. Another SEM image showed that the nanowire morphology was well-preserved upon chemical conversion. The $CsPbBr_3$ part features a width of 741 nm while the width of the $CsPbCl_3$ part shrinks to 714 nm. This 3.8% change in the nanowire width is consistent with the difference of the lattice constant between the bromide (Orthorhombic: a=8.207 Å, b=8.255 Å, c=11.759 Å, Z=4, V/Z=199.16) and chloride (Tetragonal: a=b=5.584 Å, c=5.623 Å, Z=1, V/Z=175.33) room temperature phases (the nanowire growth direction is [110]).

Figure 6A:
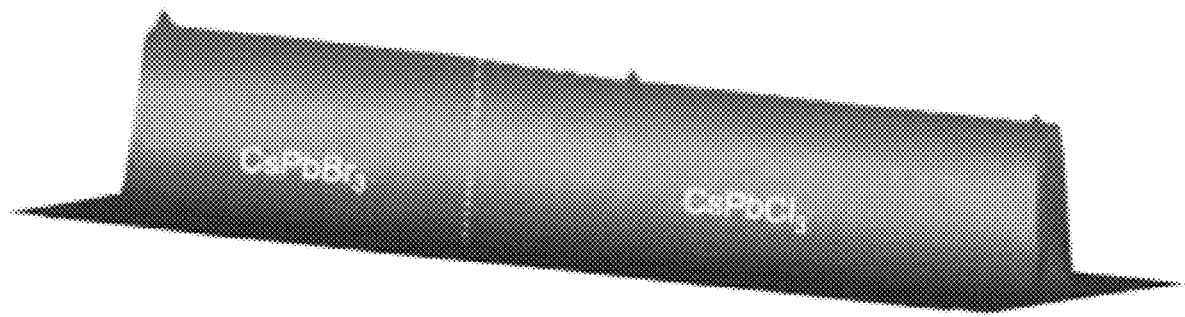
FIGS. 6A-6G show the morphology and electronic structure of a heterojunction.
Figure 6B:
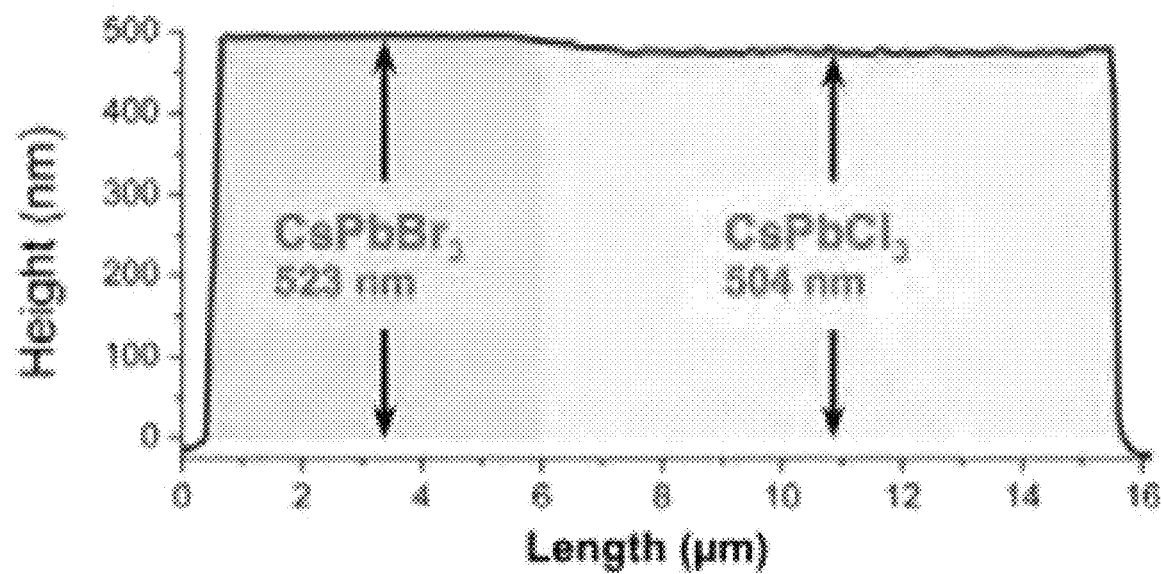

The local electronic structure of the junction was examined by scanning Kelvin probe force microscope (KPFM) combined with atomic force microscopy (AFM). FIG. 6A shows the three-dimensional (3D) AFM topographic image of a partially converted nanowire on $SiO_2$/Si. The nanowire profile reveals heights of 523 and 504 nm for the $CsPbBr_3$ and $CsPbCl_3$ parts (FIG. 6B), respectively, which again agrees well with the theoretically expected relative dimensional change. The observed gradual height transition occurring over ~1 micrometer is inherently linked to the release of structure-mismatch induced strain at the junction. No grain boundaries or cracks in the crystal were observed in the AFM and SEM images, indicating that the nanowire remains single crystalline with the heterojunction being probably of epitaxial nature. However, further study using high-resolution transmission electron microscopy is needed to elucidate the underlying atomic structure of the heterojunction. Upon chemical conversion, the nanowire maintains its high structural quality and very low surface roughness (rms<5 nm).

Figure 6C:
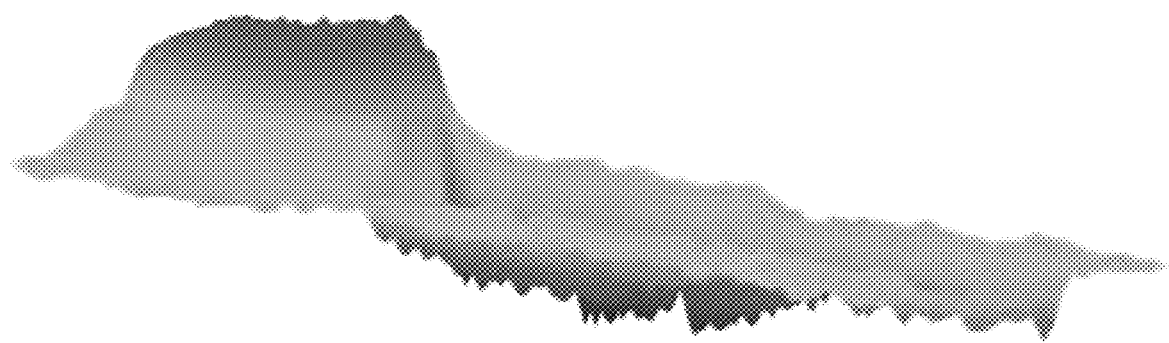
Figure 6D:
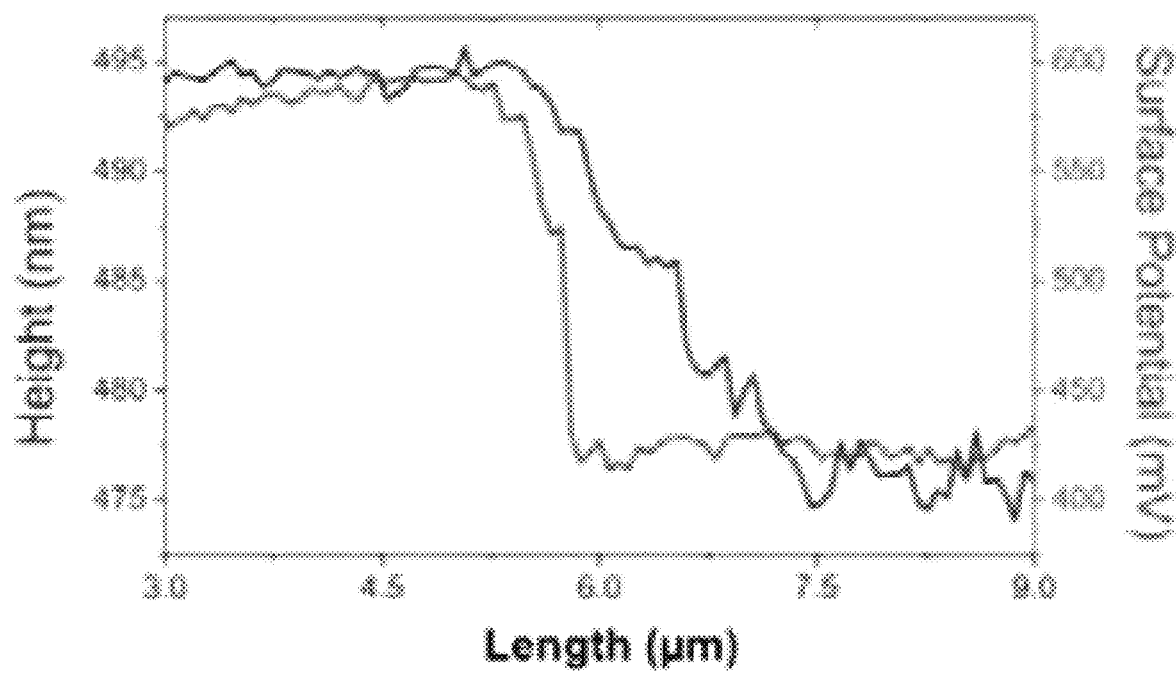

FIGS. 6C and 6D show the nanowire's 3D KPFM surface potential map and the corresponding 2D potential profile. In response to the compositional variation within the nanowire, a sharp relative surface potential change of ~190 meV is observed across the heterojunction interface. Detailed electronic characterization of various heterojunction nanowires consistently revealed higher surface potential values for the $CsPbBr_3$ part relative to the $CsPbCl_3$ part, indicating a shallower Fermi level in $CsPbBr_3$. These findings demonstrate the feasibility of this approach to create interfaces of distinct compositional and electronic properties at high spatial control.

Figure 6E:
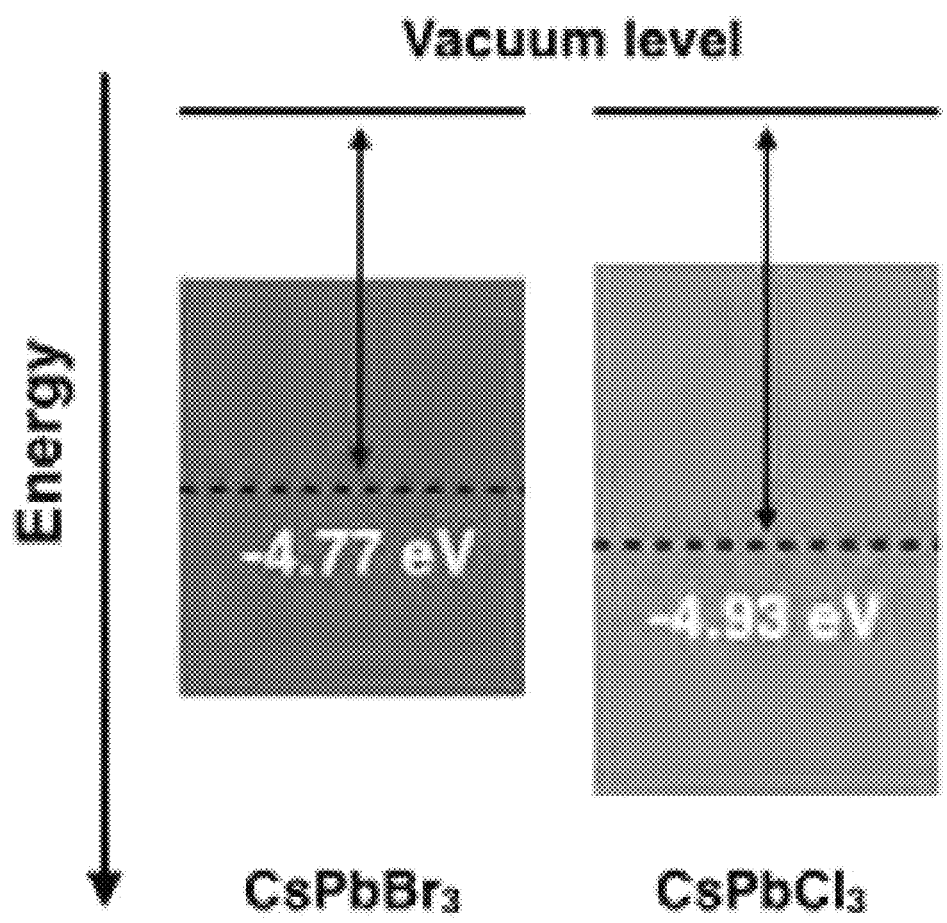
Figure 6F:
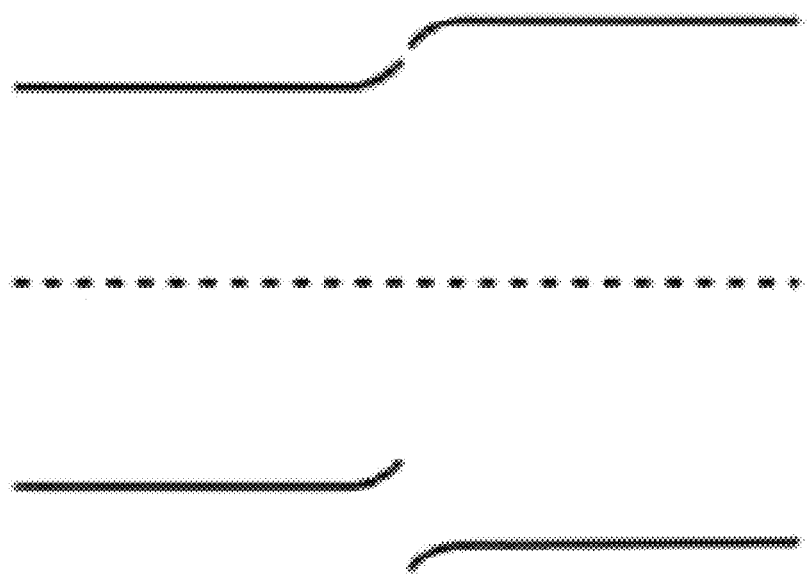

The workfunction values of pristine $CsPbBr_3$ and $CsPbCl_3$ nanowires were quantitatively determined by extensive KPFM measurements. As shown in FIG. 6E, workfunction values of 4.771±0.034 eV for $CsPbBr_3$ and 4.928±0.029 eV for $CsPbCl_3$, respectively, were obtained. The suggested band alignment at the heterojunction is shown in FIG. 6F. The band structure can be further tuned by controlling the composition and doping, which opens up new possibilities for electronic device applications.

Figure 6G:
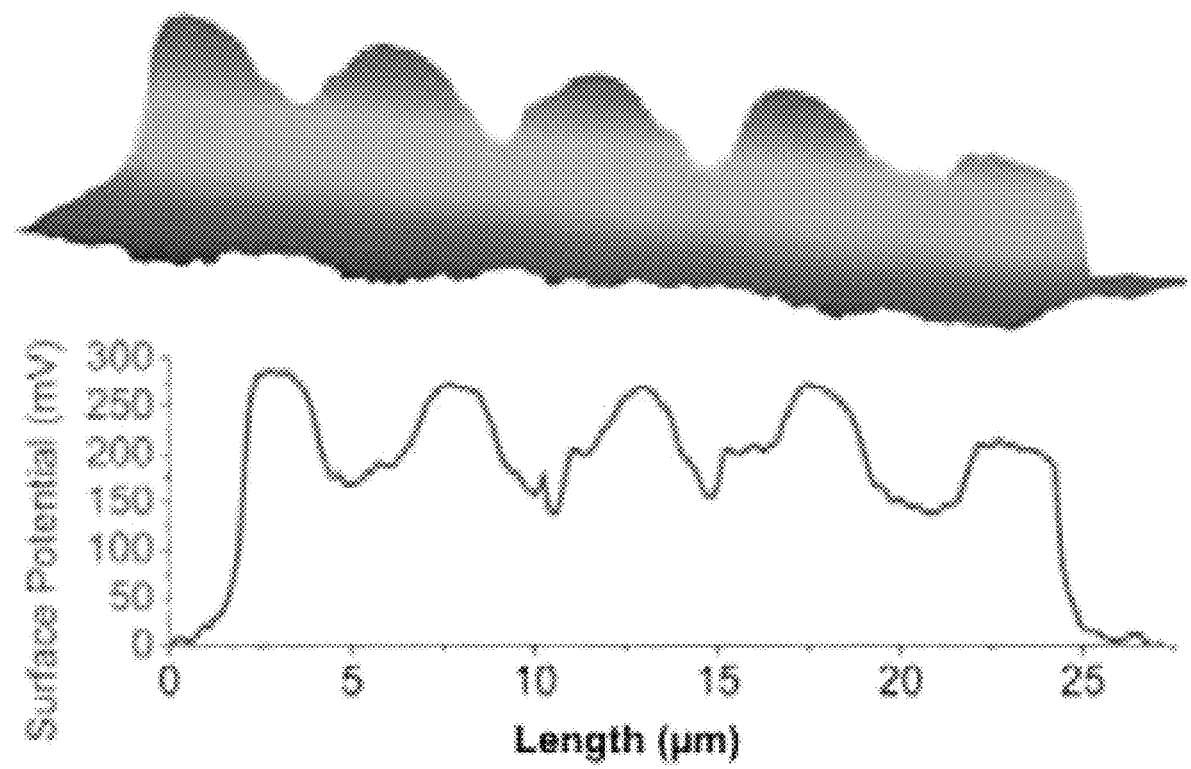

Moreover, multi-junctions in a single nanowire were demonstrated. FIG. 6G shows the 3D KPFM surface potential map and corresponding 2D potential profile of a nanowire comprising four heterojunctions with each segment being ~3 micrometers. Similar to the single heterojunction nanowire, the $CsPbBr_3$ and $CsPbCl_3$ regions feature distinct electronic characteristics.

Figure 3A:
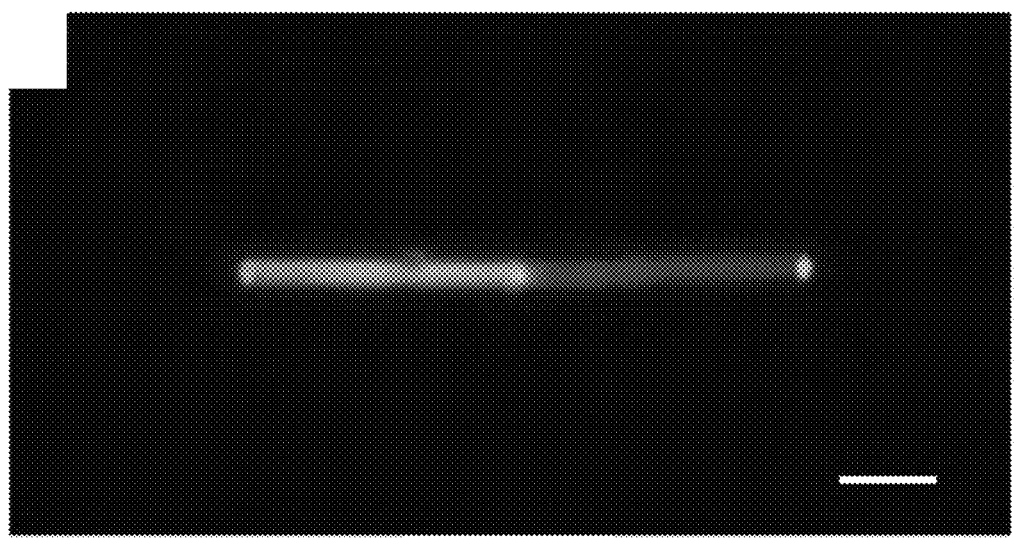
FIG. 3A shows an example of an optical image of a partial bromide partial chloride nanowire under laser excitation.
Figure 3B:
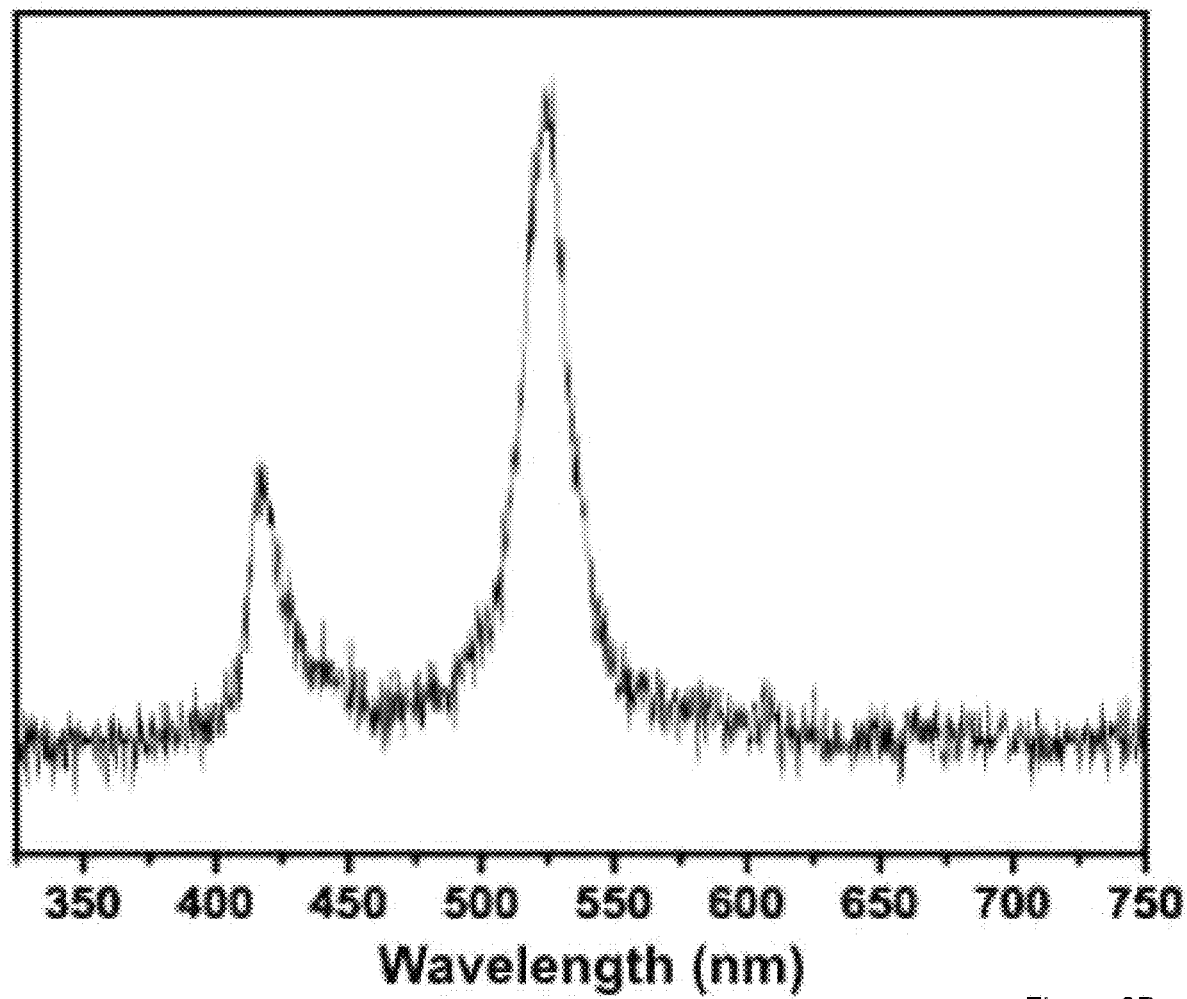
FIG. 3B shows an example of the corresponding photoluminescence spectrum.
Figure 4A:
FIG. 4A shows an example of an optical image of a partial bromide partial iodide nanowire under laser excitation.
Figure 4B:
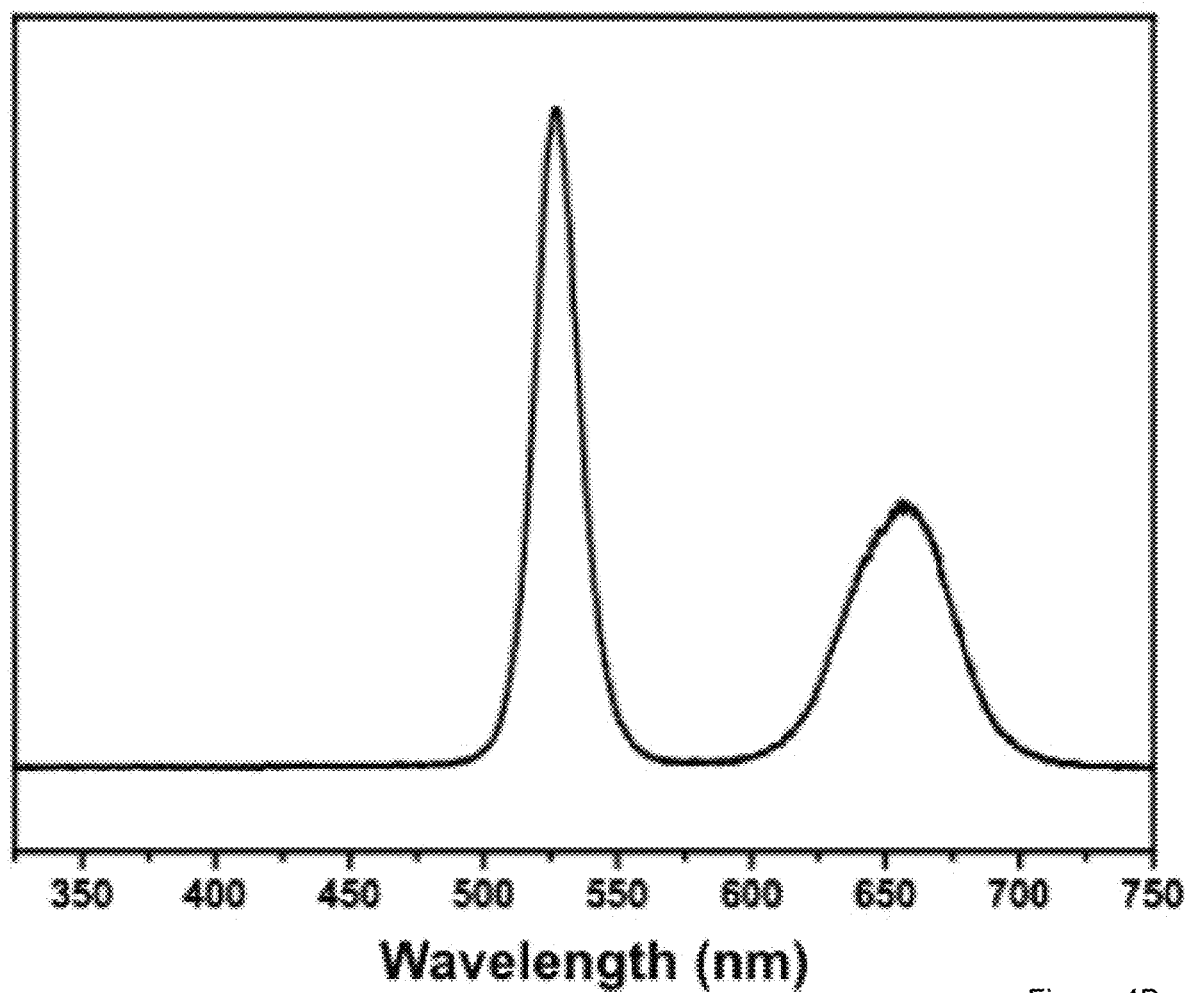
FIG. 4B shows an example of the corresponding photoluminescence spectrum.

The sharp geometric and electronic interface of the heterojunctions allows for reduction of the feature size, and the robustness of the nanowire allows for the introduction of additional fabrication steps to create multi-color heterojunctions. To study the spatially resolved patterns, confocal PL mapping technique with high spatial resolution was employed. For the Br—Cl exchanged nanowire, the confocal PL mapping results were similar to conventional PL image (e.g., as shown in FIG. 3A), with a better-resolved interface. The length of the exposed area and the covered area prior conversion were 10.8 micrometers and 8.7 micrometers long, respectively. After the conversion the lengths for the chloride and bromide regions changed to 10.8 micrometers and 8.6 micrometers (the region in between was about 100 nm). This demonstrates that the reaction is well defined at the exposed area with the PMMA coating effectively protecting the area underneath. The lambda scan on a Br—Cl exchanged nanowire shows almost no PL emission from 450 to 480 nm and a sharp transition from blue to green emission. The junction width is estimated to be less than 200 nm, which is consistent with the distinct surface potential change in the KPFM measurement as well as the SEM EDS mapping.

Figure 7C:
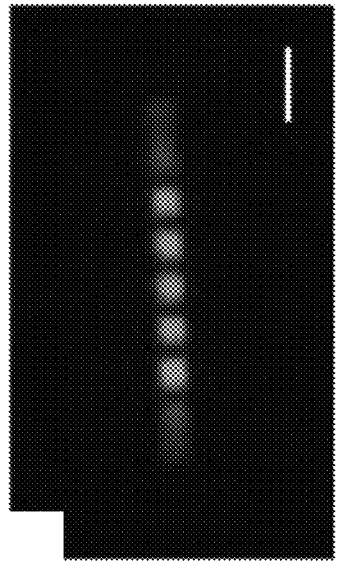
FIGS. 7A-7C show examples of confocal PL mapping of a bromide-chloride super lattice nanowire with pixel size of below 1 micron. All scale bars are 3 microns.
Figure 7B:
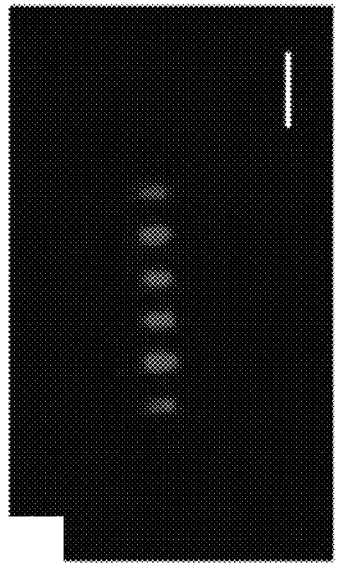
Figure 7A:
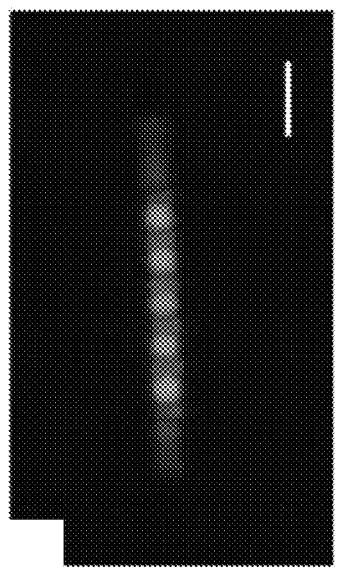

Multiple junctions with pixel size of ~1 micrometer on a nanowire were fabricated (see FIGS. 7A-7C). After conversion, the super lattice structure can be clearly resolved. The pixel size was reduced to less than 500 nm in further experiments, and the features could still be resolved.

Figure 8:
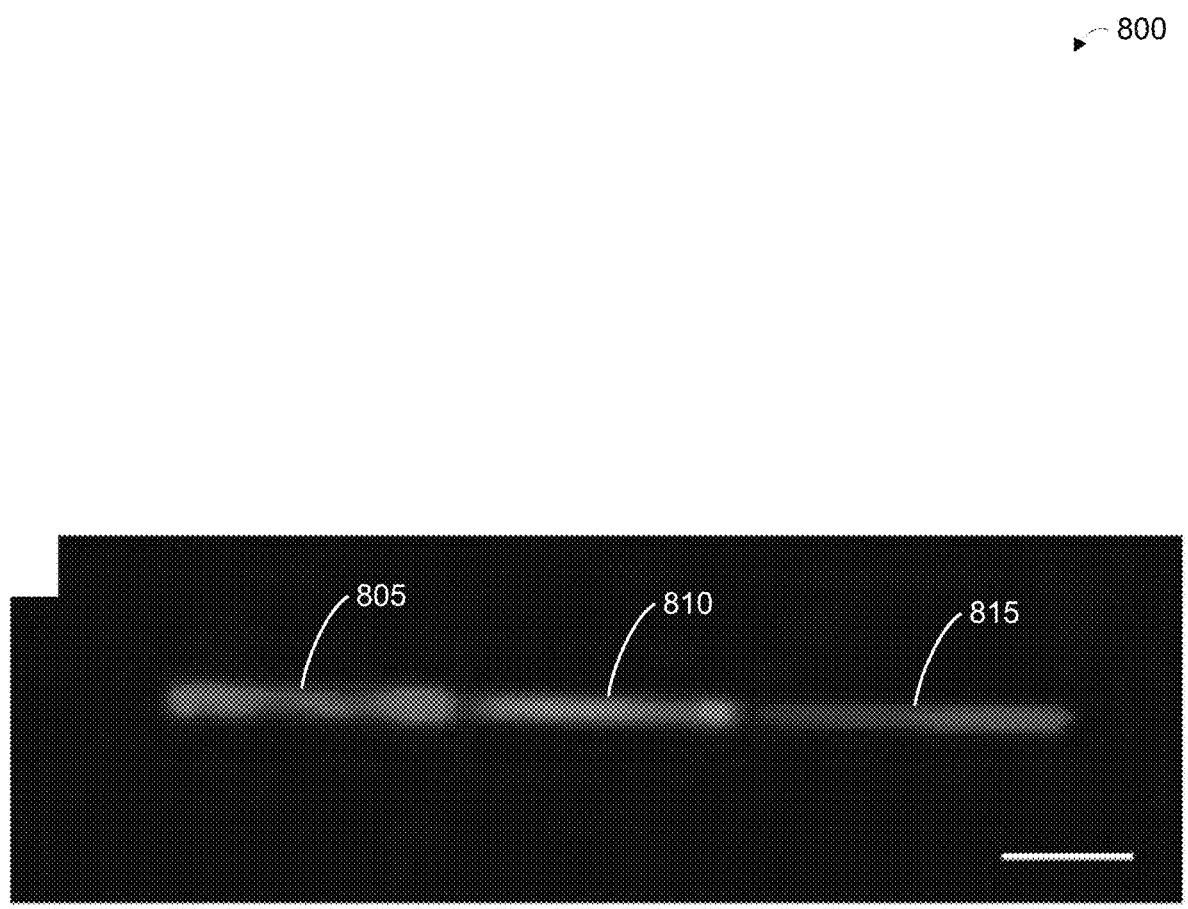
FIG. 8 shows an example of confocal PL mapping of a three-color heterojunction nanowire.

Next, based on the two-color heterostructure, another fabrication-conversion step was added: a red-green-blue three-color heterojunction was achieved, as shown in FIG. 8. The nanowire 800 shown in FIG. 8 includes three regions: the first region 805 comprises $CsPbI_3$ (red), the second region 810 comprises $CsPbBr_3$ (green), and the third region 815 comprises $CsPbCl_3$ (blue). The emission wavelength of the red and blue regions are tunable by varying the conversion degree, and the relative strength of each color can be tuned by varying the pixel size or length of each region. Such color tunable perovskite heterostructures provide an ideal platform for full color displays and solid-state lightings. The lambda scan on the three-color nanowire showed two sharp junctions at the interfaces.

The nanowire heterojunctions showed good stability. After being stored in a nitrogen atmosphere for one week, confocal PL mapping of the partial bromide partial chloride nanowire and the super lattice nanowire exhibited PL emissions and sharp junctions very similar to the initial states. These results indicate that the anion inter-diffusion occurs much slower across the heterojunction, compared to the exchange reaction at the solid-liquid interface of the exposed area. There are two possible reasons for this. First, at the exposed area, more vacancies may be introduced from the solid-liquid interface due to the interaction between the perovskite solid and the precursor molecules and ions in the solution, and higher vacancy concentration in the exposed region leads to faster ion migration and exchange reaction. Second, the ion migration may have higher activation energy along the nanowire growth direction, and thus anion exchange/migration proceeds are slightly slower along this direction.

CONCLUSION

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
providing a nanostructure comprising $ABX_3$, wherein A is selected from a group consisting of cesium (Cs) and rubidium (Rb), wherein B is selected from a group consisting of tin (Sn) and lead (Pb), and wherein X comprises a first halide selected from a group consisting of chlorine (Cl) and bromine (Br);
depositing a polymer on the nanostructure;
removing a portion of the polymer to expose a second region of the nanostructure, a first region of the nanostructure having the polymer disposed thereon; and
contacting the second region of the nanostructure with a solution including a long-chain ammonium halide including a second halide, the second halide being a different halide than the first halide and being selected from a group consisting of Cl, Br, and I, and at least some of the first halide of the nanostructure being replaced with the second halide, a resulting nanostructure comprising the first region, the second region, and a heterojunction between the first region and the second region, the first region comprising a composition $ABX_3$, the second region comprising a composition $ABY_3$, and wherein the composition of the first region and the composition of the second region are different.

2. The method of claim 1, wherein the contacting is performed for about 1 minute to 7200 minutes.

3. The method of claim 1, wherein the solvent of the solution including the long-chain ammonium halide comprises a non-polar solvent.

4. The method of claim 1, further comprising:
removing a remainder of the polymer from the nanostructure.

5. The method of claim 1, wherein during the depositing, the removing, and the contacting, the nanostructure is disposed on a substrate.

6. The method of claim 1, wherein the polymer is selected from a group consisting of methyl methacrylate (MMA), poly(methyl methacrylate) (PMMA), hydrogen silsesquioxane, and halogenated methacrylate homo and copolymers.

7. The method of claim 1, wherein the nanostructure comprising $ABX_3$ consists of a single crystal.

8. The method of claim 1, wherein the nanostructure is selected from a group consisting of a nanowire and a nanoplate.

9. The method of claim 1, wherein the nanostructure has at least one dimension that is greater than about 500 nanometers.

10. A nanostructure comprising a first region, a second region, and a heterojunction between the first region and the second region, the first region comprising a composition $ABX_3$, wherein A is selected from a group consisting of Cs and Rb, wherein B is selected from a group consisting of Sn and Pb, wherein X is selected from a group consisting of Br, Cl, and Br and Cl, the second region comprising a composition $ABY_3$, wherein Y is selected from a group consisting of Br, I, and Br and I, and wherein the composition of the first region of the nanostructure and the composition of the second region of the nanostructure are different.

11. The nanostructure of claim 10, wherein the nanostructure has at least one dimension that is greater than about 500 nanometers.

12. The nanostructure of claim 10, wherein the first region of the nanostructure comprises $AB(Br—Cl)_3$ or $ABCl_3$, and wherein the second region of the nanostructure comprises $ABBr_3$.

13. The nanostructure of claim 10, wherein the first region of the nanostructure comprises $ABBr_3$, and wherein the second region of the nanostructure comprises $AB(Br—I)_3$ or $ABI_3$.

14. The nanostructure of claim 10, wherein the first region of the nanostructure comprises $AB(Br—Cl)_3$ or $ABCl_3$, and wherein the second region of the nanostructure comprises $AB(Br—I)_3$ or $ABI_3$.

15. The nanostructure of claim 10, wherein the nanostructure consists of a single crystal.

16. The nanostructure of claim 10, wherein the nanostructure is selected from a group consisting of a nanowire and a nanoplate.

17. A nanowire comprising a first region, a second region, and a heterojunction between the first region and the second region, wherein the first region of the nanowire comprises $ABBr_3$, wherein the second region of the nanowire is selected from a group consisting of $AB(Br—Cl)_3$, $ABCl_3$, $AB(Br—I)_3$, and $ABI_3$, wherein A is selected from a group consisting of Cs and Rb, and wherein B is selected from a group consisting of Sn and Pb.

18. The nanowire of claim 17, wherein the nanowire has a diameter of about 2 nanometers to 1000 nanometers and a length greater than about 500 nanometers.

19. The nanowire of claim 17, wherein the nanowire consists of a single crystal.

* * * * *